(12) United States Patent
Murata et al.

(10) Patent No.: US 7,163,597 B2
(45) Date of Patent: Jan. 16, 2007

(54) HEAT-PEELABLE PRESSURE-SENSITIVE ADHESIVE SHEET

(75) Inventors: Akihisa Murata, Osaka (JP); Toshiyuki Oshima, Osaka (JP); Yukio Arimitsu, Osaka (JP); Kazuyuki Kiuchi, Osaka (JP)

(73) Assignee: Nitto Denko Corporation, Osaka (JP)

( * ) Notice: Subject to any disclaimer, the term of this patent is extended or adjusted under 35 U.S.C. 154(b) by 342 days.

(21) Appl. No.: 10/404,861

(22) Filed: Apr. 2, 2003

(65) Prior Publication Data

US 2003/0203193 A1 Oct. 30, 2003

Related U.S. Application Data

(62) Division of application No. 09/706,815, filed on Nov. 7, 2000, now abandoned.

(30) Foreign Application Priority Data

Nov. 8, 1999 (JP) ............................ P.11-316820

(51) Int. Cl.
*B32B 37/14* (2006.01)
*H01L 21/46* (2006.01)
*H01L 21/78* (2006.01)
*H01L 21/301* (2006.01)

(52) U.S. Cl. .................. 156/248; 156/268; 156/344; 438/464

(58) Field of Classification Search ............... 156/247, 156/248, 250, 344, 268; 438/464
See application file for complete search history.

(56) References Cited

U.S. PATENT DOCUMENTS

| | | | |
|---|---|---|---|
| 5,032,438 A * | 7/1991 | Sakumoto et al. ......... 428/41.8 |
| 5,114,789 A | 5/1992 | Reafler | |
| 5,441,810 A | 8/1995 | Aizawa et al. | |
| 5,534,102 A * | 7/1996 | Kadono et al. ............. 156/250 |
| 5,609,954 A | 3/1997 | Aizawa et al. | |
| 2002/0192463 A1 | 12/2002 | Kiuchi et al. | |

FOREIGN PATENT DOCUMENTS

| | | |
|---|---|---|
| EP | 0 612 823 A1 | 8/1994 |
| JP | 51-24534 | 7/1976 |
| JP | 56-61467 A | 5/1981 |
| JP | 56-61468 | 5/1981 |

(Continued)

OTHER PUBLICATIONS

Patent Abstracts of Japan—10168401 (Jun. 23, 1998).
Patent Abstracts of Japan—11166164 (Jun. 22, 1999).
Patent Abstracts of Japan—61078887 (Apr. 22, 1986).
Office Action in corresponding Korean application dated Jan. 13, 2006.

*Primary Examiner*—Chris Fiorilla
*Assistant Examiner*—Sing P. Chan
(74) *Attorney, Agent, or Firm*—Sughrue Mion, PLLC

(57) ABSTRACT

A heat-peelable pressure-sensitive adhesive sheet which ensures an efficient contact area even in case where the area of an adherend to be adhered is decreased and thus makes it possible to avoid adhesion failures such as chip-scattering or chipping. The heat-peelable pressure-sensitive adhesive sheet comprises a substrate and a heat-expandable pressure-sensitive adhesive layer containing heat-expandable microspheres, formed on at least one side of the substrate, wherein the surface of the heat-expandable pressure-sensitive adhesive layer before heating has a center line average roughness of 0.4 μm or less.

4 Claims, 1 Drawing Sheet

FOREIGN PATENT DOCUMENTS

Figure 1:
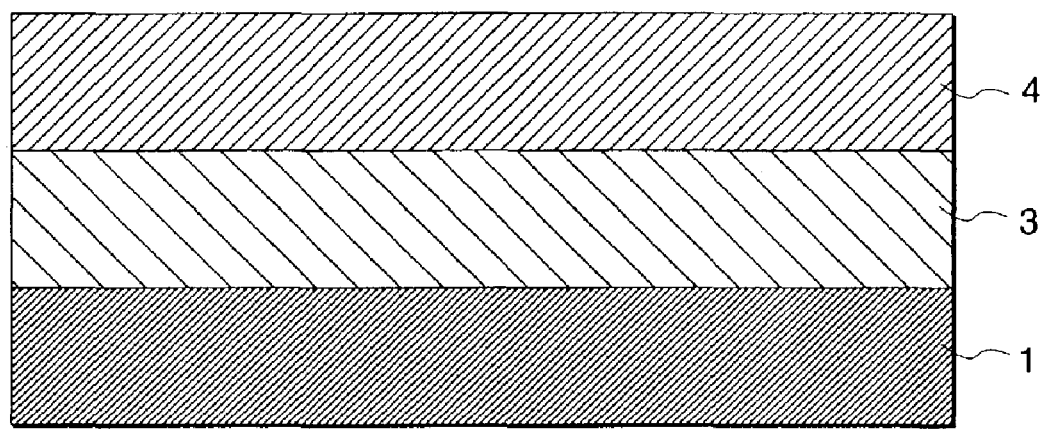

| | | |
|---|---|---|
| JP | 56-61469 | 5/1981 |
| JP | 63-33487 A | 2/1988 |
| JP | 2-305878 A | 12/1990 |
| JP | 5-43851 A | 2/1993 |
| JP | 60-252681 | 12/1995 |
| JP | 11-302610 A | 11/1999 |

* cited by examiner

HEAT-PEELABLE PRESSURE-SENSITIVE ADHESIVE SHEET

This is a divisional of application Ser. No. 09/706,815 filed Nov. 7, 2000 now abandoned; the disclosure of which is incorporated herein by reference.

FIELD OF THE INVENTION

This invention relates to a heat-peelable pressure-sensitive adhesive sheet which can be easily peeled from an adherent by heating for a short period of time at any time when required.

BACKGROUND OF THE INVENTION

Heat-peelable pressure-sensitive adhesive sheets comprising a substrate and a pressure-sensitive adhesive layer containing a foaming agent (for example, heat-expandable microspheres) or an inflating agent formed thereon have conventionally been known (see, for example, JP-B-50-13878, JP-B-51-24534, JP-A-56-61468, JP-A-56-61469 and JP-A-60-252681; the term "JP-B" as used herein means an "examined Japanese patent publication", and the term "JP-A" as used herein means an "unexamined published Japanese patent application"). These heat-peelable pressure-sensitive adhesive sheets, which establish both adhesiveness and peelability after using, are characterized in that the adhesive force is lowered by foaming or inflating the foaming agent or the like by heating so that they can be easily peeled off from an adherend. Due to this characteristic, these sheets have been used in, for example, temporary fixation in the production step of electronic parts and labels to be recycled.

With the recent tendency toward small-sized and lightweight electronic instruments, attempts have been made to downsizing and chip formation of electronic parts (condensers, LEDs, etc.) to be loaded thereon. The heat-peelable pressure-sensitive adhesive sheets are used in temporary fixation of these electronic parts in the step of cut processing. In association with the downsizing as described above, the area to be adhered per chip is also lessened and, in its turn, it becomes important to ensure a sufficient effective contact area of a chip with a pressure-sensitive adhesive sheet so as to avoid adhesion failures such as chip-scattering or chipping. However, the conventional heat-peelable pressure-sensitive adhesive sheets suffer from considerable irregularity on the surface caused by particles having relatively large diameter among heat-expandable microspheres contained in the pressure-sensitive adhesive layer and, therefore, an efficient contact area between a pressure-sensitive adhesive sheet and a chip cannot be secured, which sometimes results in chip-scattering or chipping.

SUMMARY OF THE INVENTION

Accordingly, the present invention aims at providing a heat-peelable pressure-sensitive adhesive sheet which ensures a sufficient efficient contact area even in case where the area of an adherend to be adhered is lessened and thus makes it possible to avoid adhesion failures such as chip-scattering or chipping.

As a result of extensive investigations to achieve the above-described object, it has been found that adhesion failures (chip-scattering, etc.) in association with downsizing of chips can be prevented by regulating a center line average roughness of a surface of a heat-expandable pressure-sensitive adhesive layer before heating within a specific range. The invention has been completed based on this finding.

Accordingly, an object of the present invention is to provide a heat-peelable pressure-sensitive adhesive sheet that can overcome the disadvantages in the prior art.

The heat-peelable pressure-sensitive adhesive sheet according to the present invention comprises a substrate and a heat-expandable pressure-sensitive adhesive layer containing heat-expandable microspheres formed on at least one side of the substrate, wherein a surface of the heat-expandable pressure-sensitive adhesive layer before heating has a center line average roughness of 0.4 µm or less.

BRIEF DECSRIPTION OF THE DRAWINGS

Figure 2:
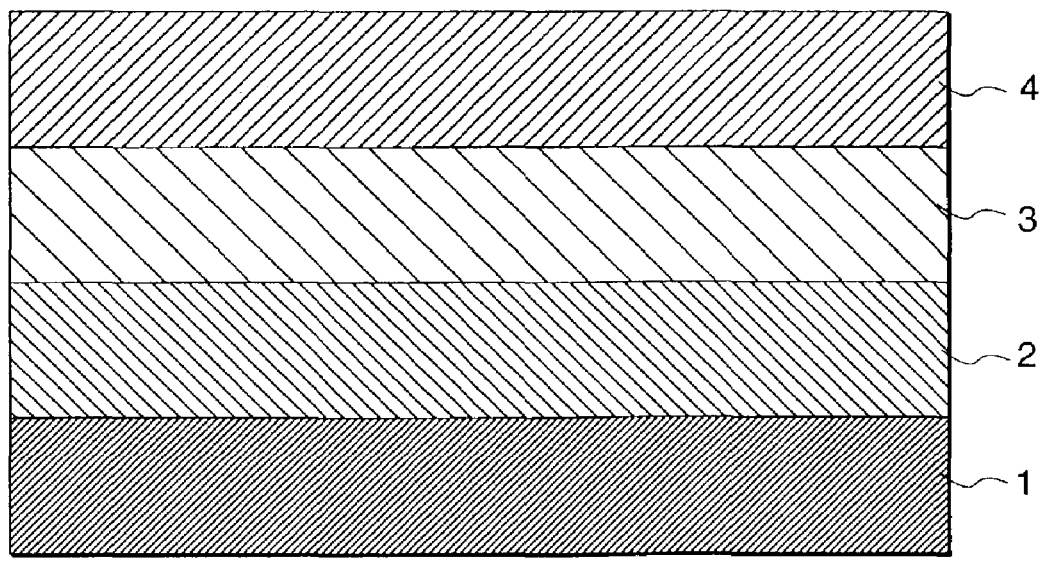

FIG. 1 is a schematic sectional view showing one example of the heat-peelable pressure-sensitive adhesive sheet according to the present invention; and FIG. 2 is a schematic sectional view showing another example of the heat-peelable pressure-sensitive adhesive sheet according to the present invention

DETAILED DESCRIPTION OF THE INVENTION

The present invention will be described in detail below by reference to, if necessary, the accompanying drawings.

FIG. 1 is a schematic sectional view showing one example of the heat-peelable pressure-sensitive adhesive sheet according to the present invention, and FIG. 2 is a schematic sectional view showing another example of the heat-peelable pressure-sensitive adhesive sheet according to the present invention.

In the example shown in FIG. 1, a heat-expandable pressure-sensitive adhesive layer 3 is formed on one side of a substrate 1, and a separator 4 is further laminated thereon. In the example shown in FIG. 2, the heat-expandable pressure-sensitive adhesive layer 3 is formed on one side of the substrate 1 through a rubber-like organic elastic layer 2, and a separator 4 is further laminated thereon.

The substrate 1 serves as a supporting matrix of the heat-expandable pressure-sensitive adhesive layer 3 and the like, and films of sheets of plastics are generally used. Examples of the substrate used in the present invention are appropriate thin films such as papers, fabrics, non-woven fabrics, metal foils, laminates of these materials with plastics, and laminates of plastic films (or sheets). In general, the substrate 1 has a thickness of 500 µm or less, preferably 1 to 300 µm, and more preferably 5 to 250 µm, although the invention is not limited thereto. To improve the adhesiveness to the heat-expandable pressure-sensitive adhesive layer 3, etc., a surface of the substrate 1 may be subjected to conventional surface treatment, for example, chemical or physical surface oxidation treatments such as chromic acid treatment, exposure to ozone, exposure to flame, exposure to high voltage shock, or ionized radiation treatment. Further, to impart favorable peelability from the heat-expandable pressure-sensitive adhesive layer 3, etc., the surface of the substrate 1 may be coated with a release agent such as silicone resins or fluorine resins.

The substrate 1 includes a low pressure-sensitive adhesive substrate or a high pressure-sensitive adhesive substrate. Examples of the low pressure-sensitive adhesive substrate include substrates comprising non-polar polymers such as olefin resins (polyethylene, polypropylene, etc.) and substrates surface-coated with the release agent described above. Examples of the high pressure-sensitive adhesive substrates include substrates comprising highly polar polymers (polyester, etc.) and substrates having been subjected to surface oxidation treatments by the above-described chemical or physical methods.

The low pressure-sensitive adhesive substrate is used as the substrate for a substrate-peelable pressure-sensitive adhesive sheet, which can easily peels the substrate and a layer on the substrate. Such a substrate-peelable pressure-sensitive adhesive sheet can be used as an adhesive for temporary fixation such that after adhering the substrate-peelable pressure-sensitive adhesive sheet to an adherend a, the substrate is peeled to remain the heat-expandable pressure-sensitive adhesive layer on the adherend a and another adherend b is adhered to this heat-expandable pressure-sensitive adhesive layer. When the adhered state is desired to relieve, the adherend a can easily be separated from the adherend b by heat treatment. On the other hand, the high pressure-sensitive adhesive substrate is used as the substrate for a substrate-fixed pressure-sensitive adhesive sheet wherein the substrate is strongly bonded to a layer provided thereon. Such a substrate-fixed pressure-sensitive adhesive sheet can be adhered to an adherend at a predetermined adhesive force, and also can easily be peeled or separated by heat treatment at any time when the adhered state is desired to relieve.

The rubber-like organic elastic layer 2 has a function of, in adhering the heat-peelable pressure-sensitive adhesive sheet to an adherend, establishing good follow-up property of the surface of the pressure-sensitive adhesive sheet to the surface shape of the adherend to thereby enlarge the adhesion area, and also a function of, in heat-peeling the pressure-sensitive adhesive sheet from an adherend, highly (accurately) controlling heat expansion of the heat-expandable pressure-sensitive adhesive layer to thereby predominantly and uniformly expand the heat-expandable pressure-sensitive adhesive layer in the thickness direction.

To impart the above functions, the rubber-like organic elastic layer 2 is preferably formed using natural rubbers, synthetic rubbers or synthetic resins having rubber elasticity, which have a D-scale Shore hardness (determined in accordance with ASTM D-2240) of 50 or less, preferably 40 or less.

Examples of the synthetic rubber or synthetic resin having the rubber elasticity include nitrile-based, diene-based or acrylic synthetic rubbers; polyolefin-based or polyester-based thermoplastic elastomers; and synthetic resins having rubber elasticity such as ethylene-vinyl acetate copolymer, polyurethane, polybutadiene and soft polyvinyl chloride. Even substantially hard polymers such as polyvinyl chloride can exhibit rubber elasticity by blending additives such as a plasticizer or a softener therewith. Compositions thus obtained can also be used as a material constituting the rubber-like organic elastic layer. Further, pressure-sensitive adhesive materials, such as pressure-sensitive adhesives, constituting the heat-expandable pressure-sensitive adhesive layer 3 as will be described hereinafter can preferably be used as the constituent material of the rubber-like organic elastic layer 2.

The rubber-like organic elastic layer 2 has a thickness of generally about 500 µm or less (for example, about 1 to 500 µm), preferably 3 to 300 µm and more preferably 5 to 150 µm.

The rubber-like organic elastic layer 2 can be formed in an appropriate manner, for example, a method of applying a coating solution containing an elastic layer-forming material such as the above-described natural rubber, synthetic rubbers or synthetic reins having rubber elasticity onto the substrate 1 (coating method); a method of adhering a film comprising the above-described elastic layer-forming material or a laminate film prepared by previously forming a layer comprising the elastic layer-forming material on one or more heat-expandable pressure-sensitive adhesive layers 3, to the substrate 1 (dry laminating method); or a method of co-extruding a resin composition containing the material constituting the substrate 1 and a resin composition containing the above-described elastic layer-forming material (co-extrusion method).

The rubber-like organic elastic layer 2 may be made of a pressure-sensitive adhesive substance comprising natural rubbers, synthetic rubbers or synthetic reins having rubber elasticity as the main component. Alternatively, it may be made of, for example, a foamed film mainly comprising such components. Foaming can be conducted by conventional methods, for example, a method of mechanically stirring, a method of using a gas formed by reaction, a method of using a foaming agent, a method of removing soluble matters, a method of using a spray, a method of forming syntactic foam, or a sintering method. The rubber-like organic elastic layer 2 may be composed of a single layer or two or more layers.

The heat-expandable pressure-sensitive adhesive layer 3 contains a pressure-sensitive adhesive for imparting pressure-sensitive adhesive property and heat-expandable microspheres (microcapsules) for imparting heat-expandability. Due to this constitution, the adhesion area of the heat-expandable pressure-sensitive adhesive layer 3 to an adherent can be decreased by adhering the pressure-sensitive adhesive sheet to the adherent and then heating the heat-expandable pressure-sensitive adhesive layer 3 at any time when required, to conduct foaming and/or expansion treatment of the heat-expandable microspheres. As a result, the pressure-sensitive adhesive sheet can be easily peeled off. In the use of a foaming agent which is not microencapsulated, good peelability cannot be developed in a stable state.

Pressure-sensitive adhesives that do not restrict the foaming and/or expansion of the heat-expandable microspheres as less as possible in the heating step are preferable. Such pressure-sensitive adhesives are conventional pressure-sensitive adhesives such as rubber-based pressure-sensitive adhesives, acrylic pressure-sensitive adhesives, vinyl alkyl ether-based pressure-sensitive adhesives, silicone-based pressure-sensitive adhesives, polyester-based pressure-sensitive adhesives, polyamide-based pressure-sensitive adhesives, urethane-based pressure-sensitive adhesives, styrene/diene block copolymer-based pressure-sensitive adhesives and pressure-sensitive adhesives having been improved in creep properties by blending hot-melt resins having a melting point of about 200° C. or lower with these pressure-sensitive adhesives, as described in, for example, JP-A-56-62468, JP-A-61-174857, JP-A-63-17981, JP-A-56-13040. Those pressure-sensitive adhesive can be use alone or as a combination of two or more thereof. The pressure-sensitive adhesive may contain, in addition to the pressure-sensitive adhesive component (base polymer), appropriate additives such as crosslinking agents (polyisocyanate, melamine alkyl ethers, etc.), tackifiers (rosin derivative resins, polyterpene resins, petroleum resins, oil-soluble phenol resins, etc.), plasticizers, fillers, antioxidants and the like.

Examples of the pressure-sensitive adhesive generally used include rubber-based pressure-sensitive adhesives containing natural rubber or various synthetic rubbers as the base polymer; and acrylic pressure-sensitive adhesives containing as the base polymer, acrylic polymers (homopolymers or copolymers) comprising one or more alkyl (meth) acrylates (for example, $C_{1-20}$ alkyl esters such as methyl ester, ethyl ester, propyl ester, isopropyl ester, butyl ester, isobutyl ester, s-butyl ester, t-butyl ester, pentyl ester, hexyl ester, heptyl ester, octyl ester, 2-ethylhexyl ester, isooctyl ester, isodecyl ester, dodecyl ester, tridecyl ester, pentadecyl ester, hexadecyl ester, heptadecyl ester, octadecyl ester, nonadecyl ester and eicosyl ester) as monomer components.

If necessary, the above acrylic polymers may further contain units corresponding to other monomer components copolymerizable with the above-described alkyl (meth)acrylates so as to improve, for example, cohesive force, heat resistance or crosslinking properties. Examples of such monomer components include carboxyl group-containing monomers such as acrylic acid, methacrylic acid, carboxyethyl acrylate, carboxypentyl acrylate, itaconic acid, maleic acid, fumaric acid and crotonic acid; acid anhydride monomers such as maleic anhydride and itaconic anhydride; hydroxyl group-containing monomers such as hydroxyethyl (meth)acrylate, hydroxypropyl (meth) acrylate, hydroxybutyl (meth) acrylate, hydroxyhexyl (meth) acrylate, hydroxyoctyl (meth) acrylate, hydroxydecyl (meth)acrylate, hydroxylauryl (meth)acrylate and (4-hydroxymethylcyclohexyl)methyl methacrylate; sulfonate group-containing monomers such as styrenesulfonic acid, allylsulfonic acid, 2-(meth)acrylamido-2-methylpropanesulfonic acid, (meth) acrylamidopropanesulfonic acid, sulfopropyl (meth)acrylate and (meth)acryloyloxynaphthalenesulfonic acid;(N-substituted) amide monomers such as (meth)acrylamide, N,N-dimethyl (meth)acrylamide, N-butyl (meth)acrylamide, N-methylol (meth)acrylamide and N-methylolpropane (meth)acrylamide; aminoalkyl (meth)acrylate monomers such as aminoethyl (meth)acrylate, N,N-dimethylaminoethyl (meth)acrylate and t-butylaminoethyl (meth)acrylate; alkoxyalkyl (meth)acrylate monomers such as methoxyethyl (meth)acrylate and ethoxyethyl (meth)acrylate; maleimide monomers such as N-cyclohexyl maleimide, N-isopropyl maleimide, N-lauryl maleimide and N-phenyl maleimide; itaconimide monomers such as N-methyl itaconimide, N-ethyl itaconimide, N-butyl itaconimide, N-octyl itaconimide, N-2-ethylhexyl itaconimide, N-cyclohexyl itaconimide and N-lauryl itaconimide; succinimide monomers such as N-(meth)acryloyloxymethylene succinimide, N-(meth) acryloyl-6-oxyhexamethylene succinimide and N-(meth) acryloyl-8-oxyoctamethylene succinimide; vinyl monomers such as vinyl acetate, vinyl propionate, N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinyl carbonamides, styrene, α-methylstyrene and N-vinylcaprolactam; cyanoacrylate monomers such as acrylonitrile and methacrylonitrile; epoxy group-containing acrylic monomers such as glycidyl (meth)acrylate; glycol acrylate monomers such as polyethylene glycol (meth)acrylate, polypropylene glycol (meth)acrylate, methoxyethylene glycol (meth)acrylate and methoxypolypropylene glycol (meth) acrylate; acrylate monomers having heterocycle, halogen atom or silicone atom such as tetrahydrofurfuryl (meth) acrylate, fluorine (meth)acrylate and silicone (meth)acrylate; polyfunctional monomers such as hexanediol (meth) acrylate, (poly)ethylene glycol di(meth)acrylate, (poly) propylene glycol di(meth)acrylate, neopentyl glycol di(meth)acrylate, pentaerythritol di(meth)acrylate, trimethylolpropane tri(meth)acrylate, pentaerythritol tri(meth)acrylate, dipentaerythritol hexa(meth)acrylate, epoxy acrylate, polyester acrylate and urethane acrylate; olefin monomers such as isoprene, butadiene and isobutylene; and vinyl ether monomers such as vinyl ether. Those monomer components can be used alone or as mixtures of two or more thereof.

Considering the balance between appropriate adhesive force before heat treatment and degree of decrease of adhesive force after heat treatment, more preferable pressure-sensitive adhesive is a pressure-sensitive adhesive comprising, as the base polymer, a polymer having a dynamic elastic modulus of 50,000 to 1,000,000 dyn/cm² at room temperature to 150° C.

The heat-expandable microspheres that can be used in the present invention are microcapsules obtained by encapsulating an appropriate substance which can be easily gasified and expanded by heating (for example, isobutane, propane or pentane) in an elastic shell. In many cases, such a shell is made of a hot-melt material or a material which breaks upon heating. Examples of the shell-forming material include vinylidene chloride-acrylonitrile copolymer, polyvinyl alcohol, polyvinyl butyral, polymethyl methacrylate, polyacrylonitrile, polyvinylidene chloride and polysulfone. The heat-expandable microspheres can be produced by a conventional method, for example, coarcelvation or interfacial polymerization. The heat-expandable microspheres also include commercially available heat-expandable microspheres, for example, MICROSPHRERE™ (manufactured by Matsumoto Yushi Seiyaku K.K.).

To efficiently lower the adhesive force of the pressure-sensitive adhesive layer by heat treatment, heat-expandable microspheres having an appropriate strength such that those are not broken until the volume expansion ratio attains at least 5 times, preferably at least 7 times and more preferably at least 10 times are preferable.

The content of the heat-expandable microspheres may be appropriately determined depending on, for example, the expansion ratio of the pressure-sensitive adhesive layer and the degree of decrease of the adhesive force. In general, the heat-expandable microspheres are used in an amount of, for example, 1 to 150 parts by weight, preferably 10 to 130 parts by weight and more preferably from 25 to 100 parts by weight, per 100 parts by weight of the base polymer constituting the heat-expandable pressure-sensitive adhesive layer 3.

The heat-expandable pressure-sensitive adhesive layer 3 can be formed in a conventional manner, for example, a method of preparing a coating solution containing the pressure-sensitive adhesive and the heat-expandable microspheres optionally together with a solvent and then applying the solution onto the substrate 1 or the rubber-like organic elastic layer 2, or a method of applying the above-described coating solution onto an appropriate separator (for example, release paper) to form the heat-expandable pressure-sensitive adhesive layer and then transferring (shifting) it onto the substrate 1 or the rubber-like organic elastic layer 2. The heat-expandable pressure-sensitive adhesive layer may comprise a single layer or multilayers.

An important characteristic of the invention resides in that the center line average roughness of the surface of the heat-expandable pressure-sensitive adhesive layer before heating is 0.4 μm or less (for example, about 0.02 to 0.4 μm). The center line average roughness is preferably 0.3 μm or less (for example, about 0.02 to 0.3 μm), more preferably 0.2

μm or less (for example, about 0.02 to 0.2 μm). Further, the maximum roughness of the surface of the heat-expandable pressure-sensitive adhesive layer before heating is preferably 5 μm or less (for example, about 0.1 to 5 μm), more preferably 3 μm or less (for example, about 0.5 to 3 m).

The center line average roughness and maximum roughness of the surface of the heat-expandable pressure-sensitive adhesive layer before heating can be controlled by appropriately selecting the thickness of the heat-expandable pressure-sensitive adhesive layer 3 and the particle diameter of the heat-expandable microspheres added to the heat-expandable pressure-sensitive adhesive layer.

To ensure the center line average roughness of the surface of the heat-expandable pressure-sensitive adhesive layer before heating being 0.4 μm or less and the maximum roughness of the surface of the heat-expandable pressure-sensitive adhesive layer before heating being 5 μm or less, the particle diameter of the heat-expandable microspheres preferably has the relationship of "thickness of the heat-expandable pressure-sensitive adhesive layer 3≧particle diameter of the heat-expandable micorspheres". If the particle diameter of the heat-expandable microspheres is greater than the thickness of the heat-expandable pressure-sensitive adhesive layer 3, the surface roughness of the heat-expandable pressure-sensitive adhesive layer 3 becomes large, resulting in decreasing the effective adhesion area thereof to the adherent. In case of providing the rubber-like organic elastic layer 2 between the substrate 1 and the heat-expandable pressure-sensitive adhesive layer 3, it is expected that the rubber-like organic elastic layer 2 would achieve an compensating effect even though the particle diameter of the heat-expandable microspheres is somewhat greater than the thickness of the heat-expandable pressure-sensitive adhesive layer 3. Thus, the above relationship does not apply in such a case. The particle diameter of the heat-expandable microspheres can be controlled during the formation of the heat-expandable microspheres. Alternatively, it may be controlled by, for example, classification after the formation.

The thickness of the heat-expandable pressure-sensitive adhesive layer 3 is preferably 300 μm or less, more preferably 100 μm or less. If the heat-expandable pressure-sensitive adhesive layer 3 has an excessively large thickness, cohesive failure frequently arises in the peeling step after heating and the pressure-sensitive adhesive remains on the adherend, thereby contaminating the adherend. On the other hand, if the heat-expandable pressure-sensitive adhesive layer 3 has an excessively small thickness, the heat-expandable pressure-sensitive adhesive layer 3 shows only a small extent of deformation upon heating and thus the adhesive force cannot be smoothly lowered. In such a case, it becomes sometimes necessary to control the particle diameter of the heat-expandable microspheres added to the heat-expandable pressure-sensitive adhesive layer to an excessively small level. Taking these points into consideration, the thickness of the heat-expandable pressure-sensitive adhesive layer 3 is preferably 5 μm or more, more preferably 10 μm or more and most preferably 15 μm or more.

The separator 4 that can be used is conventional release papers and the like. The separator 4 is used as a protector for the heat-expandable pressure-sensitive adhesive layer 3, and is peeled off when adhering the pressure-sensitive adhesive sheet to an adherend. It is not always necessary to provide the separator 4.

The heat-expandable pressure-sensitive adhesive layer 3 can be formed on one side or both sides of the substrate 1. If required and necessary, the rubber-like organic elastic layer 2 may be provided on one side or both sides of the substrate 1 so as to be interposed between the substrate 1 and the heat-expandable pressure-sensitive adhesive layer 3. It is also possible that the heat-expandable pressure-sensitive adhesive layer 3 is formed on one side of the substrate 1 and a usual adhesive layer free from any heat-expandable microspheres is formed on the other side thereof. Further, an intermediate layer such as an undercoating layer or an adhesive layer may be provided, for example, between the substrate 1 and the rubber-like organic elastic layer 2, or between the rubber-like organic elastic layer 2 and the heat-expandable pressure-sensitive adhesive layer 3.

Because of having a small center line average roughness of the surface of the heat-expandable pressure-sensitive adhesive layer before heating, the heat-peelable pressure-sensitive adhesive sheet according to the invention ensures a sufficient effective contact area with a work when it is used as, for example, a tape for temporary fixing in cutting an electronic part even in case where the area to be adhered is decreased due to downsizing and chipping. Thus, failures (chip-scattering, positioning error, etc.) caused by insufficient adhesive force can be avoided. Therefore, the heat-peelable pressure-sensitive adhesive sheet according to the invention contributes to the prevention of decrease in the productivity or yield.

In the heat-peelable pressure-sensitive adhesive sheet having the rubber-like organic elastic layer provided between the substrate and the heat-expandable pressure-sensitive adhesive layer, the pressure-sensitive adhesive sheet surface well follows up the surface shape of an adherent to which the heat-peelable pressure-sensitive adhesive sheet is adhered, due to the elasticity of the rubber-like organic elastic layer. Thus, a large adhesion area can be obtained and the adhesive strength can be increased. When the heat-peelable pressure-sensitive adhesive sheet is peeled off by heating, the expansion (volume change) of the heat-expandable pressure-sensitive adhesive layer can be accurately controlled and expansion can be carried out preferentially in the thickness direction uniformly, which further facilitates peeling. Even in case where the heat-expandable microspheres contained in the heat-expandable pressure-sensitive adhesive layer have a somewhat large particle diameter, the irregularity thus caused is compensated by the rubber-like organic elastic layer and thus the surface roughness of the heat-expandable pressure-sensitive adhesive layer can be minimized.

Although the heat-peelable pressure-sensitive adhesive sheet according to the invention can be used to permanently bond an appropriate article serving as an adherend, it is appropriately used in case where an adherend is adhered for a definite period of time and, after achieving the adhesion, the adhesion state is relieved. In particular, the heat-peelable pressure-sensitive adhesive sheet of the invention is suitably used in producing chip parts with smaller size, i.e., downsizing/chipping of electronic parts (for example, semiconductor wafers, chips, ceramic condensers, oscillators, etc.).

Heat treatment conditions for facilitating peeling of the pressure-sensitive adhesive sheet of the invention from an adherend can be appropriately determined considering the extent of decreasing the adhesion area, which depends on the surface conditions of the adherend and the type of the heat-expandable microspheres, the heat resistance of the adherend, the heating means used and the like. The heating treatment is generally conducted at 100 to 250° C. for 1 to 90 seconds (in case of using a hot plate, etc.) or for 5 to 15 minutes (in case of using a hot air dyer, etc.). Under such heat treatment conditions, the heat-expandable microspheres in the pressure-sensitive adhesive layer are expanded and/or foamed and thus the pressure-sensitive adhesive layer is expanded and deformed so that the adhesive force is decreased or lost. The heat treatment can be conducted at an arbitrary step depending on the purpose of use. In some cases, an infrared lamp, hot water, etc., can be used as a heating source.

The heat-peelable pressure-sensitive adhesive sheet according to the invention ensures an effective contact area and prevents adhesion failures such as chip-scattering even in case where the adhesion area of an adherend such as a chip is decreased.

The present invention will be described in greater detail by reference to the following Examples, but it should be understood that the invention is not construed as being limited thereto. Particle size was measured using a laser scattering diffraction grain size distribution meter (Model SALD-2000J, manufactured by Shimadzu Corporation).

EXAMPLE 1

Heat-expandable microspheres A (MATSUMOTO MICROSPHRERE F-50D; manufactured by Matsumoto Yushi Seiyaku K.K., average particle diameter: 13.4 μm, maximum particle diameter: 63 μm) were classified using a centrifugal wind-force classifier to obtain classified heat-expandable microspheres B (average particle diameter: 12.3 μm, maximum particle diameter: 42 μm).

A solution containing 100 parts by weight of a 2-ethyl-hexyl acrylate/ethyl acrylate/methyl methacrylate (30 parts by weight/70 parts by weight/5 parts by weight) copolymer-based pressure-sensitive adhesive (containing 2 parts by weight of a polyurethane crosslinking agent) and 30 parts by weight of the classified heat-expandable microspheres B obtained above in toluene was prepared. The resulting solution was applied onto a polyester film having a thickness of 100 μm at a dry thickness of 45 μm and dried to obtain a heat-peelable pressure-sensitive adhesive sheet.

A ceramic sheet (before sintering) having a size of 120 mm×100 mm×0.5 mm (thickness) was temporarily fixed to the pressure-sensitive adhesive face of the heat-peelable pressure-sensitive adhesive sheet obtained above, and the assembly was mounted and fixed on a dicing ring, followed by full-cutting into chips (0.6 mm×0.3 mm) using a rotary blade. After cutting, the chips were heated to 130° C. for 60 seconds on a hot plate while mounting and fixing to the dicing ring as such. After cooling, the chips were collected by reversal vibration.

EXAMPLE 2

A solution containing a 2-ethylhexyl acrylate/ethyl acrylate/methyl methacrylate copolymer-based pressure-sensitive adhesive (containing 1 parts by weight of a polyurethane crosslinking agent) in toluene was applied onto a polyester film having a thickness of 100 μm at a dry thickness of 10 μm and dried to form a rubber-like organic elastic layer.

A solution containing 100 parts by weight of a 2-ethyl-hexyl acrylate/ethyl acrylate/methyl methacrylate copolymer-based pressure-sensitive adhesive (containing 2 parts by weight of a polyurethane crosslinking agent) and 30 parts by weight of the classified heat-expandable microspheres B in toluene was prepared in the same manner as in Example 1. The resulting solution was applied onto a separator at a dry thickness of 35 μm and dried to form a pressure-sensitive adhesive layer. The pressure-sensitive adhesive layer thus formed was adhered to a rubber-like organic elastic layer side of the polyester film having the rubber-like organic elastic layer formed thereon to obtain a heat-peelable pressure-sensitive adhesive sheet.

A ceramic sheet (before sintering) having a size of 120 mm×100 mm×0.5 mm (thickness) was temporarily fixed to the pressure-sensitive adhesive face of the heat-peelable pressure-sensitive adhesive sheet obtained above and mounted and fixed to a dicing ring, followed by full-cutting into chips (0.6 mm×0.3 mm) using a rotary blade. After cutting, the chips were heated to 130° C. for 60 seconds on a hot plate while mounting and fixing to the dicing ring as such. After cooling, the chips were collected by reversal vibration.

EXAMPLE 3

The procedure of Example 1 was followed except for adding heat-expandable microspheres C (MATSUMOTO MICROSPHRERE F-301D; manufactured by Matsumoto Yushi Seiyaku K.K., average particle diameter: 11.6 μm, maximum particle diameter: 42 μm) to the pressure-sensitive adhesive layer in place of the classified heat-expandable microspheres B and changing the heat treatment conditions after cutting chips to 100° C.×60 seconds.

COMPARATIVE EXAMPLE 1

The procedure of Example 1 was followed except for adding heat-expandable microspheres A (MATSUMOTO MICROSPHRERE F-50D; manufactured by Matsumoto Yushi Seiyaku K. K., average particle diameter: 13.4 μm, maximum particle diameter: 63 μm) to the pressure-sensitive adhesive layer in place of the classified heat-expandable microspheres B.

COMPARATIVE EXAMPLE 2

The procedure of Example 2 was followed except for adding heat-expandable microspheres A (MATSUMOTO MICROSPHRERE F-50D; manufactured by Matsumoto Yushi Seiyaku K. K., average particle diameter: 13.4 μm, maximum particle diameter: 63 μm) to the pressure-sensitive adhesive layer in place of the classified heat-expandable microspheres B.

Evaluation Test

Center line average roughness, maximum roughness and chip retention ratio in the cutting stage of the pressure-sensitive adhesive sheets before heating obtained in Examples and Comparative Examples are shown in the Table below. The center line average roughness and maximum roughness of the surface of the pressure-sensitive adhesive layer were measured with a non-contact three dimensional surface roughness meter (manufactured by ZYGO). Adhesion retention was not observed on the peeled surface of chips after heat peeling and recovering those in any Examples and Comparative Examples.

TABLE 1

|  | Center line average roughness (μm) | Maximum roughness (μm) | Chip-retention ratio (%) |
|---|---|---|---|
| Example 1 | 0.11 | 1.50 | 100 |
| Example 2 | 0.12 | 1.89 | 100 |
| Example 3 | 0.12 | 1.77 | 100 |
| Comparative Example 1 | 0.49 | 8.14 | 70 |

TABLE 1-continued

|  | Center line average roughness (μm) | Maximum roughness (μm) | Chip-retention ratio (%) |
|---|---|---|---|
| Comparative Example 2 | 0.73 | 7.43 | 80 |

What is claimed is:

1. A method of temporarily fixing an electronic part in the step of cut processing, comprising
applying a heat-peelable pressure-sensitive adhesive sheet to the electronic part,
performing said cut processing, and
removing said heat-peelable pressure-sensitive adhesive sheet from the part,
wherein said heat-peelable pressure-sensitive adhesive sheet comprises a substrate and a heat-expandable pressure-sensitive adhesive layer containing heat-expandable microspheres, formed on at least one side of the substrate, wherein a surface of said heat-expandable pressure-sensitive adhesive layer before heating has a center line average roughness of 0.4, μm or less, and the particle diameter of the heat-expandable microspheres satisfies the relationship: thickness of the heat-expandable pressure-sensitive adhesive layer particle diameter of the heat-expandable microspheres.

2. The method of temporarily fixing an electronic part in the step of cut processing as claimed in claim 1, wherein a surface of said heat-expandable pressure-sensitive adhesive layer before heating has a maximum roughness of 5 μm or less.

3. The method of temporarily fixing an electronic part in the step of cut processing as claimed in claim 1, wherein the heat-peelable pressure-sensitive adhesive sheet comprises a rubber-like organic elastic layer provided between the substrate and the heat-expandable pressure-sensitive adhesive layer.

4. The method of temporarily fixing an electronic part in the step of cut processing as claimed in claim 3, wherein said rubber-like organic elastic layer comprises a pressure-sensitive adhesive substance.

* * * * *